(12) United States Patent
De Conti et al.

(10) Patent No.: US 11,916,061 B2
(45) Date of Patent: Feb. 27, 2024

(54) ELECTRONIC CIRCUIT

(71) Applicant: STMicroelectronics SA, Montrouge (FR)

(72) Inventors: Louise De Conti, Grenoble (FR); Philippe Galy, Le Touvet (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 18/095,728

(22) Filed: Jan. 11, 2023

(65) Prior Publication Data

US 2023/0163117 A1 May 25, 2023

Related U.S. Application Data

(62) Division of application No. 16/869,840, filed on May 8, 2020, now Pat. No. 11,581,303.

(30) Foreign Application Priority Data

May 9, 2019 (FR) ...................................... 1904838

(51) Int. Cl.
*H01L 27/02* (2006.01)
*H01L 27/12* (2006.01)
*H01L 29/74* (2006.01)

(52) U.S. Cl.
CPC ...... *H01L 27/0262* (2013.01); *H01L 27/0277* (2013.01); *H01L 27/1203* (2013.01); *H01L 29/7436* (2013.01)

(58) Field of Classification Search
CPC ............. H01L 29/74; H01L 2924/1301; H01L 29/66363; H01L 29/7436; H01L 27/1027; H01L 27/0817; H01L 29/42308
See application file for complete search history.

(56) References Cited

U.S. PATENT DOCUMENTS

| | | |
|---|---|---|
| 5,682,047 A | 10/1997 | Consiglio et al. |
| 6,121,661 A | 9/2000 | Assaderaghi et al. |
| 6,594,132 B1 | 7/2003 | Avery |
| 6,790,713 B1 | 9/2004 | Horch |
| 9,905,565 B1 * | 2/2018 | El Dirani ............... H10B 12/20 |
| 2004/0137690 A1 * | 7/2004 | Mallikarjunaswamy .................... H01L 29/7393 438/322 |

(Continued)

FOREIGN PATENT DOCUMENTS

| | | |
|---|---|---|
| CN | 105702674 A | 6/2016 |
| FR | 2955200 A1 | 7/2011 |

(Continued)

OTHER PUBLICATIONS

INPI Search Report and Written Opinion for FR 1904838 dated Jan. 9, 2020 (11 pages).

(Continued)

*Primary Examiner* — Samuel Park
(74) *Attorney, Agent, or Firm* — Crowe & Dunlevy

(57) ABSTRACT

An electronic circuit includes a first electronic component formed above a buried insulating layer of a substrate and a second electronic component formed under the buried insulating layer. The insulating layer is thoroughly crossed by a semiconductor well. The semiconductor well electrically couples a terminal of the first electronic component to a terminal of the second electronic component.

18 Claims, 7 Drawing Sheets

(56) References Cited

U.S. PATENT DOCUMENTS

| | | |
|---|---|---|
| 2005/0083619 A1 | 4/2005 | Steinhoff |
| 2006/0043411 A1 | 3/2006 | Bhattacharyya |
| 2007/0012945 A1 | 1/2007 | Sugizaki |
| 2007/0096203 A1 | 5/2007 | Mouli |
| 2007/0158678 A1* | 7/2007 | Udrea ................. H01L 29/402 |
| | | 257/E29.037 |
| 2008/0088993 A1 | 4/2008 | Entringer et al. |
| 2013/0049065 A1 | 2/2013 | Menard |
| 2014/0015002 A1* | 1/2014 | Fonteneau ............ H01L 29/749 |
| | | 257/133 |
| 2014/0167099 A1 | 6/2014 | Mergens |
| 2015/0077888 A1 | 3/2015 | Galy et al. |
| 2015/0116029 A1* | 4/2015 | Litty ................. H03K 17/687 |
| | | 257/339 |

FOREIGN PATENT DOCUMENTS

| | | |
|---|---|---|
| FR | 2982416 A1 | 5/2013 |
| FR | 3005203 A1 | 10/2014 |

OTHER PUBLICATIONS

PH.Galy et al: "Symmetrical ESD trigger and pull-up using BIMOS transistor in Advanced CMOS technology", Microelectronics Reliability, vol. 52, No. 9-10, Sep. 2012 (Sep. 2012), pp. 1998-2004, XP055067245, ISSN: 0026-2714, DOI: 10.1016/j.microrel.2012. 06.117 partie 3 (Full symmetrical trigger and pull-up with BOMIS); figure 3.

* cited by examiner

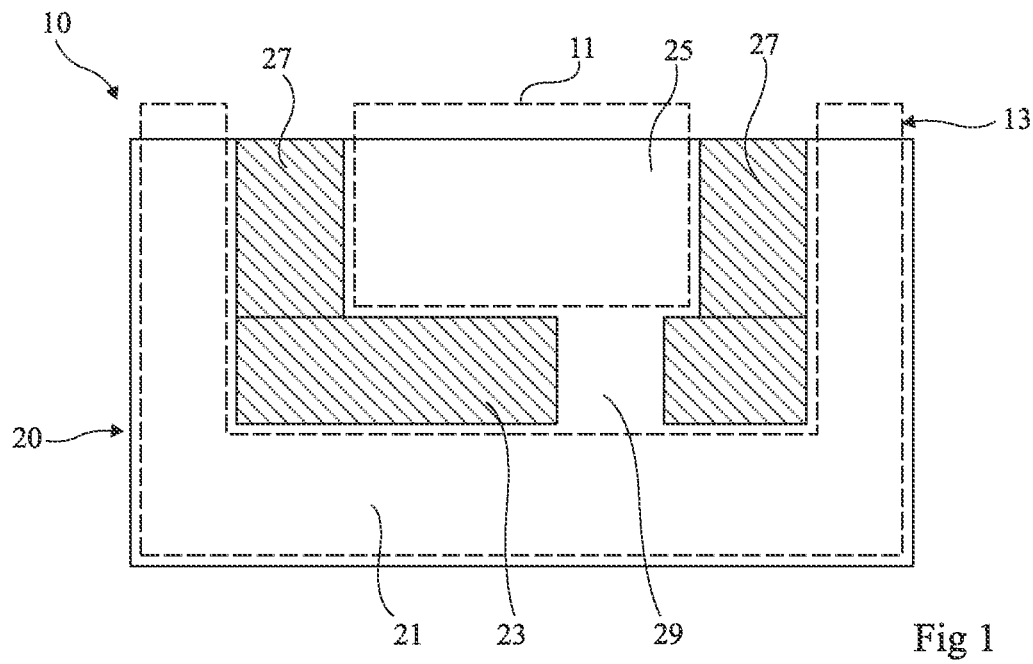
Fig 1
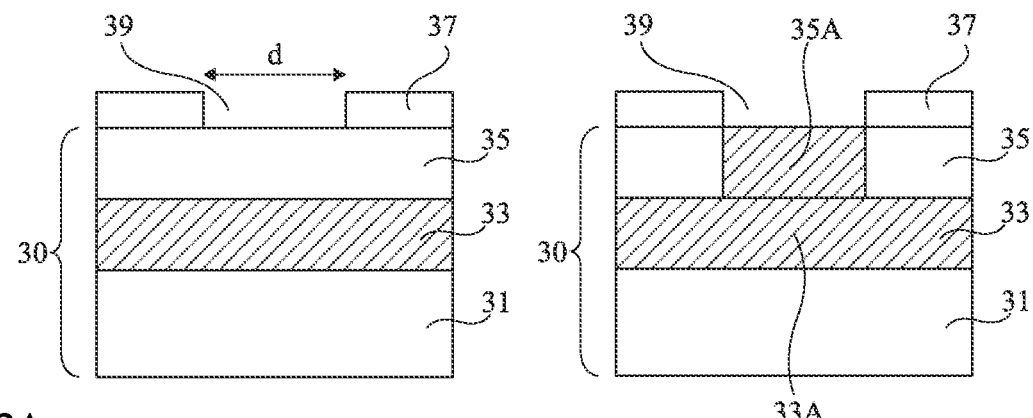
Fig 2A
Fig 2B
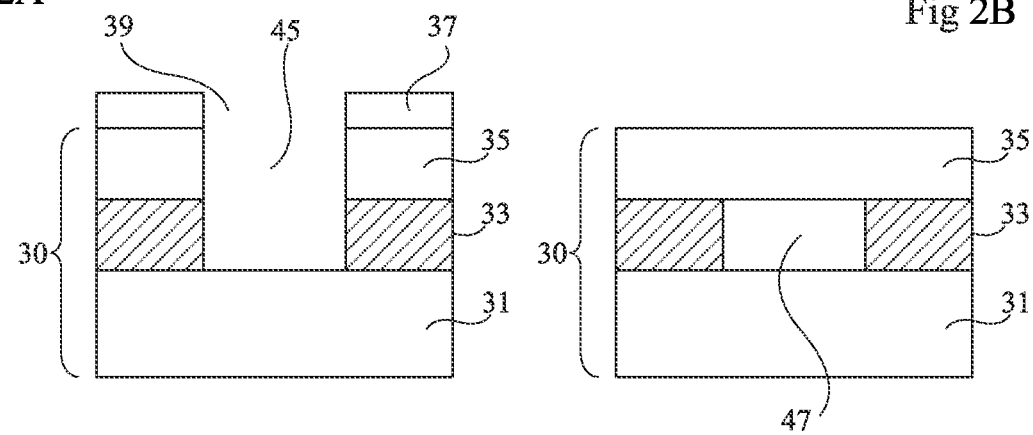
Fig 2C
Fig 2D

ELECTRONIC CIRCUIT

CROSS REFERENCE TO RELATED APPLICATIONS

This application is a divisional of U.S. patent application Ser. No. 16/869,840, filed May 8, 2020, which claims the priority benefit of French Application No. 1904838, filed on May 9, 2019, the contents of which are hereby incorporated by reference in their entireties to the maximum extent allowable by law.

TECHNICAL FIELD

The present disclosure generally concerns electronic circuits and, more particularly, electronic circuits manufactured from an SOI-type (Silicon On Insulator) structure

BACKGROUND

Many electronic circuits are manufactured with components formed from an SOI-type structure. Such a structure is formed of a semiconductor substrate having an insulating layer, and then a semiconductor layer, deposited thereon. The insulating layer is generally an oxide layer, referred to in the art as a buried oxide (BOX) layer. The semiconductor substrate and the semiconductor layer are, for example, made of silicon or of an alloy of silicon and of one or a plurality of other compounds.

The electronic components of the circuit may be formed in different ways in the SOI structure. Doped wells may be formed in the different semiconductor layers of the structure. Stacks of layers of different materials and doping levels may be formed, for example, by successive depositions and/or by masking steps.

There is a need in the art for electronic circuits overcoming all or part of the disadvantages of known electronic circuits and, more particularly, overcoming all or part of the disadvantages of circuits having some of their electronic components formed inside and on top of an SOI-type structure.

There is a need in the art for electronic circuits of higher performance and which are, for example, more compact.

SUMMARY

An embodiment overcomes all or part of the disadvantages of known electronic circuits.

An embodiment provides an electronic circuit comprising a first electronic component formed above a buried insulating layer, and a second electronic component formed under said layer, wherein said insulating layer is thoroughly crossed by at least one semiconductor well coupling the first and second components.

According to an embodiment, the circuit is formed inside and on top of a structure of silicon-on-insulator or SOI type, wherein the buried insulating layer is the buried oxide layer of the structure of silicon-on-insulator type.

According to an embodiment, the circuit is an electrostatic discharge protection circuit.

According to an embodiment, the first component is a trigger device.

According to an embodiment, the trigger device comprises a BiMOS-type transistor.

According to an embodiment, the BiMOS-type transistor is an N-type MOS or NMOS transistor comprising: an N-type doped source region; an N-type doped drain region; a gate region; and a P-type doped channel region, and further comprising a channel contact region in contact with said channel region, said channel contact region being coupled to the gate of the NMOS transistor.

According to an embodiment, the trigger device further comprises a resistor.

According to an embodiment, said resistor is coupled to the gate region of the BiMOS transistor.

According to an embodiment, the second component is an electrostatic discharge protection device.

According to an embodiment, the electrostatic discharge protection device is a thyristor.

According to an embodiment, the thyristor is a cathode-gate thyristor.

According to an embodiment, the semiconductor well couples the gate of the thyristor to the channel contact region of the BiMOS-type transistor.

According to an embodiment, the thyristor is an anode-gate thyristor.

According to an embodiment, the semiconductor well couples the gate of the thyristor to the drain region of the BiMOS-type transistor.

BRIEF DESCRIPTION OF THE DRAWINGS

The foregoing and other features and advantages will be discussed in detail in the following non-limiting description of specific embodiments in connection with the accompanying drawings.

FIG. 1 schematically shows a cross-section view of an embodiment of an electronic circuit;

FIGS. 2A-2D illustrating steps of a method of manufacturing the electronic circuit of FIG. 1;

DETAILED DESCRIPTION

Figure 3:
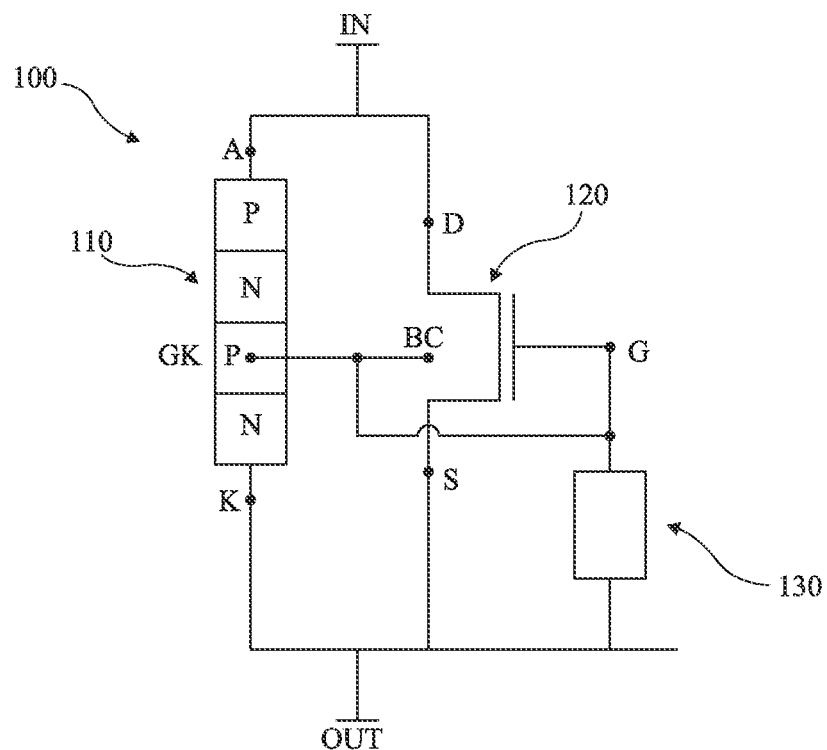
FIG. 3 shows a circuit diagram of an embodiment of an electronic circuit according to FIG. 1.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, preferably of plus or minus 5%, of the value in question.

In the present description the following technical definitions are applied:

lightly-doped semiconductor layer designates a layer having a dopant atom concentration in the range from $10^{14}$ to $5 \times 10^{17}$ atoms/cm$^3$;

heavily-doped semiconductor layer designates a layer having a dopant atom concentration in the range from $10^{17}$ to $10^{18}$ atoms/cm$^3$; and very heavily-doped semiconductor layer designates a layer having a dopant atom concentration in the range from $10^{18}$ to $10^{21}$ atoms/cm$^3$.

FIG. 1 is a cross-section view of all or part of an electronic circuit 10 formed inside and on top of an SOI-type structure 20.

Structure 20 comprises a semiconductor substrate 21, an insulating layer 23, also called buried insulating layer (BOX), and a semiconductor layer 25. Insulating layer 23 is arranged between substrate 21 and semiconductor layer 25. Substrate 21 is, for example, made of silicon or of another semiconductor material. Insulating layer 23 is, for example, made of silicon oxide. Semiconductor layer 25 is, for example, made of silicon or of another semiconductor material.

According to an embodiment, insulating layer 23 does not cover the entire width of substrate 21, and is laterally delimited by the location of insulating walls 27 which extending from an upper surface of insulating layer 23 to an upper surface of semiconductor layer 25. An insulating wall 27 is arranged at the location of each end (i.e., peripheral edge) of semiconductor layer 25.

Insulating layer 23 and insulating walls 27 delimit an area 11 in the semiconductor layer 25, indicated with dotted lines in FIG. 1, inside and on top of which a portion of a first electronic component may be formed.

Substrate 21 and the rest of semiconductor layer 25 located outside of the insulating walls 27 define a U-shaped area 13, indicated with dotted lines in FIG. 1, and inside and on top of which all or part of a second electronic component may be formed.

Examples of circuit 10 and examples of electronic components which may be formed in areas 11 and 13 will be described in relation with FIGS. 3, 5, and 7 to 9.

According to an embodiment, insulating layer 23 is not continuous along its entire length, that is, it is interrupted in one or a plurality of locations (a single one in the example of FIG. 1) by a cavity filled, for example, with semiconductor material. The cavity forms a coupling well 29 extending between area 11 and a portion of U-shaped area 13. According to an embodiment, coupling well 29 may enable to couple doped areas of the two components formed inside and on top of areas 11 and 13. For this purpose, well 29 may, for example, be N-type or P-type doped.

An advantage of this embodiment is to enable to replace a wire connection between two electronic components in areas 11 and 13 with coupling well 29. Such a replacement may allow other layouts of the components of circuit 10, and may enable to obtain a circuit 10 which is more compact and which has a higher performance.

FIGS. 2A-2D illustrate steps of a method of forming a coupling well, of the type of the coupling well 29 described in relation with FIG. 1, in an SOI-type structure 30.

As previously described, SOI-type structure 30 is formed of a semiconductor substrate 31 having an insulating layer 33 and a semiconductor layer 35 successively resting thereon. Substrate 31 is for example made of silicon. Insulating layer 33 is, for example, made of silicon oxide. Semiconductor layer 35 is, for example, made of silicon.

At the step of FIG. 2A, a mask 37 made of a rigid material is deposited on top of and in contact with the upper surface of semiconductor layer 35. Mask 37 comprises an opening 39 of width d. Width d defines the width of the coupling well to be formed.

At the step of FIG. 2B, a portion 35A of semiconductor layer 35 defined by opening 39 is oxidized, across its entire thickness. Portion 35A thus has a width equal to width d. Portion 35A rests on a portion 33A of insulating layer 33 also having a width equal to width d.

At the step of FIG. 2C, portion 35A of semiconductor layer 35 and portion 33A of insulating layer 33 are etched, for example, by a wet etch method to leave space for a cavity 45. In other words, cavity 45 thus extends from an upper surface of substrate 31 to the level of an upper surface of semiconductor layer 35. Cavity 45 has a width equal to width d of opening 39 of mask 37.

At the step of FIG. 2D, cavity 45 is totally filled with semiconductor material by an epitaxial growth method. A coupling well 47, similar to the coupling well 29 described in relation with FIG. 1, is formed in insulating layer 33, and semiconductor layer 35 no longer has a cavity. In other words, semiconductor layer 35 is thus continuous again, and insulating layer 33 is then discontinuous. As an example, well 47 is made of a semiconductor material which may be N-type or P-type doped.

FIG. 3 is a circuit diagram of an example of an electronic circuit 100 capable of being formed in a structure of the type of the structure described in relation with FIG. 1.

Electronic circuit 100 is an electrostatic discharge (ESD) protection circuit. Circuit 100 is capable of being coupled between two terminals of a circuit to be protected, for example, between an input terminal and an output terminal. For this purpose, circuit 100 comprises input/output terminals IN and OUT capable of being coupled, preferably connected, to input/output terminals of a circuit to be protected. As an example, terminal IN is coupled to an input terminal of a circuit to be protected, and terminal OUT is coupled to an output terminal or to a terminal delivering a reference potential, for example, the ground, of said circuit to be protected.

Circuit 100 comprises a cathode gate thyristor 110, a BiMOS-type transistor 120, and a resistor 130.

Cathode-gate thyristor 110 is represented in FIG. 3 by its physical model representing its doping structure, and more particularly its P-N junctions. A thyristor comprises a P-N-P-N type stack of layers. The anode of thyristor 110 is formed by the P-type doped layer at one of its ends and is symbolized by a node A. The cathode of thyristor 110 is formed by the N-type doped layer of the other end and is symbolized by a node K. The gate of thyristor 110 is formed by the P-type doped layer on the side of the cathode layer. The gate is symbolized by a node GK.

Anode A of thyristor 110 is coupled, preferably connected, to terminal IN. Cathode K of the thyristor is coupled, preferably connected, to terminal OUT.

BiMOS-type transistor 120 is an N-channel MOS transistor (NMOS) further comprising a contact region coupled to the channel-forming region in the lightly-doped P-type substrate, or channel region, of the NMOS transistor. This contact region is called channel contact or body contact region hereafter, symbolized by a node BC. More particularly, the channel contact region is a very heavily-doped P-type region (P+).

Transistor 120 conventionally comprises a very heavily-doped N-type drain region (N+), symbolized by a node D, a gate region, symbolized by a node G, and a very heavily-doped N-type source region (N+), symbolized by a node S. An example of a structure forming a BiMOS-type transistor is described in relation with FIG. 4.

Drain D of transistor 120 is coupled, preferably connected, to terminal IN. Source S of the transistor is coupled, preferably connected, to terminal OUT. Channel contact BC is coupled, preferably connected, to gate G. Further, channel contact BC is coupled, preferably connected, to gate GK of thyristor 110.

Gate G of transistor 120 is coupled to terminal OUT via resistor 130. In other words, gate G of transistor 120 is coupled, preferably connected, to a terminal of resistor 130. The other terminal of resistor 130 is coupled, preferably connected, to terminal OUT.

Circuit 100 generally operates as follows.

Thyristor 110 is the protection component enabling to dissipate a potential positive electrostatic discharge occurring between terminals IN and OUT. Indeed, a thyristor is a component generally having a high bulk conduction, which enables it to dissipate currents of high intensity.

It may occur for thyristors to have a too high a trigger voltage to protect a circuit against an electrostatic discharge. It is thus necessary, in this case, to couple them to a trigger circuit having a lower trigger voltage to form a circuit of protection against electrostatic discharges triggering at the adequate voltage.

Transistor 120 and resistor 130 form a trigger circuit capable of triggering at a voltage lower than the trigger voltage of thyristor 110. Resistor 130 enables to more precisely adjust the trigger voltage of transistor 120.

The detailed operation of circuit 100 will be described in relation with FIG. 4.

Figure 4:
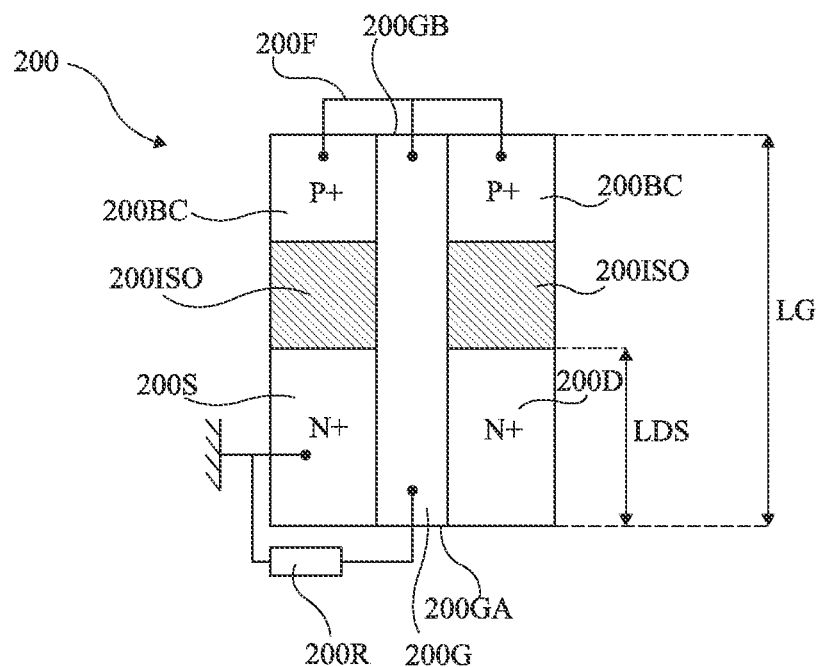
FIG. 4 schematically shows a top view of a BiMOS-type transistor.

FIG. 4 is a simplified top view of an example of a structure of a BiMOS-type transistor 200.

As previously mentioned in relation with FIG. 3, a BiMOS-type transistor is an N-channel MOS transistor (NMOS) further comprising a very heavily-doped P-type region (P+) in contact with the channel-forming region in the lightly-doped P-type substrate (P−), or channel region, of the NMOS transistor and forming a channel contact.

The transistor 200 of FIG. 4 comprises: a very heavily-doped N-type source region 200S (N+); a very heavily-doped N-type drain region 200D (N+); a lightly-doped P-type channel region (P−) (not shown in FIG. 4) arranged, in top view, between source and drain regions 200S and 200D; a gate region 200G arranged on the channel region; and two very heavily-doped P-type channel contact regions 200BC (P+).

In this structure, the channel and gate regions 200G have a length LG greater than length LDS of source and drain regions 200S and 200D. More particularly, source and drain regions 200S and 200D extend from an end 200GA of the channel and gate regions 200G.

Channel contact regions 200BC are arranged on either side of the channel and gate regions 200G, and extend along these regions from an end 200GB opposite to end 200GA. Source and drain regions 200S and 200D are separated from channel contact regions 200BC by insulating regions 200ISO.

A specificity of a BiMOS-type transistor, when it is used as a component of protection against electrostatic discharges, is that the channel contact region(s) are connected by one or a plurality of wires or vias to the gate region. Thus, channel contact regions 200BC are connected to gate region 200G by one or a plurality of wires or vias 200F.

A BiMOS-type transistor may be used as a protection against overvoltages. To achieve this, a way of connecting BiMOS-type transistor 200 is the following: coupling its source region 200S to a node receiving a reference voltage; coupling its drain region 200D to an input node; and coupling its gate region to the node receiving the reference voltage via a resistor 200R.

Transistor 200, in this case, operates as follows. A stray capacitance (noted drain-gate capacitance) is formed by drain and gate regions 200D and 200G. The drain-gate capacitance and resistor 200R form an RC circuit. When an overvoltage occurs on the input node, it biases drain region 200D which, by capacitive effect, biases gate region 200G. Gate region 200G being coupled to channel contact regions 200BC by wire(s) or via(s) 200F, channel contact regions 200BC are, further, biased. Transistor 200 then triggers and becomes conductive.

The detailed operation of circuit 100 of FIG. 3 is the following.

When a positive electrostatic discharge occurs on terminal IN of circuit 100, it first triggers BiMOS-type transistor 120, which turns on, according to the above-described operation. Thus, the channel contact region BC of transistor 120 is positively biased. This region being coupled to the gate region of thyristor 110, the gate region is also positively biased. Thyristor 110 then turns on and dissipates the electrostatic discharge. More particularly, thyristor 110 turns on when the voltage between terminals IN and OUT exceeds the trigger voltage of transistor 120.

Figure 5A:
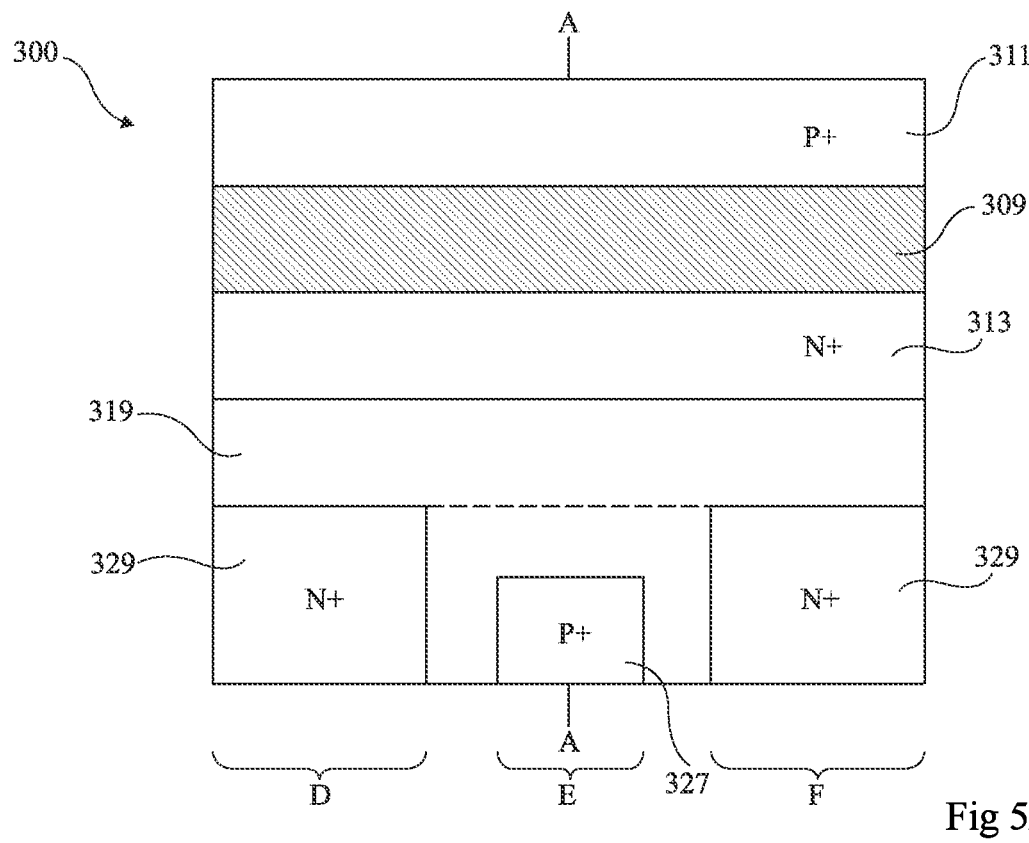
FIGS. 5A and 5B show a top view and a cross-section view, respectively, of an embodiment of the circuit of FIG. 3.
Figure 5B:
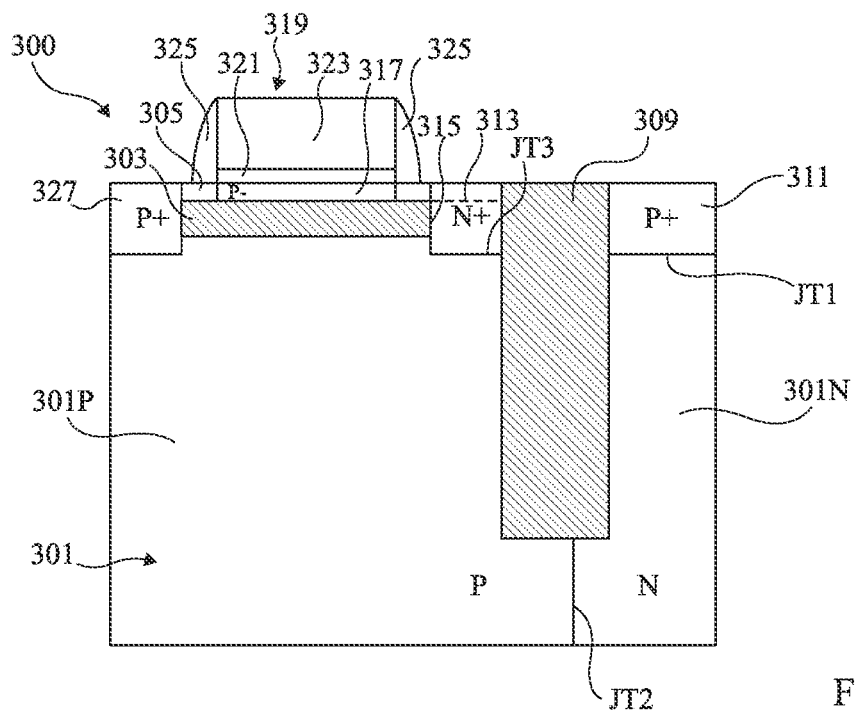

FIGS. 5A and 5B show a top view and a cross-section view, respectively, of an embodiment of a first possible structure 300 of circuit 100 described in relation with FIG. 3. FIG. 5B is a cross-section view along an axis A-A of FIG. 5A.

Structure 300 is formed from a structure of the type of structure 10 described in relation with FIG. 1 but comprising a single insulating wall (FIG. 5B), where: the substrate is a semiconductor substrate 301; the buried insulating layer is an insulating layer 303, for example, made of silicon oxide; the semiconductor layer is a layer 305; and the insulating wall is an insulating wall 309 extending from the upper surface of the structure down to a depth beyond the lower surface of insulating layer 303.

Substrate 301 is divided into a P-type doped portion 301P (P) and an N-type doped portion 301N (N). Insulating trench 309 (shown in FIGS. 5A and 5B) separates portions 301N and 301P. Portion 301P is arranged under insulating layer 303. In FIG. 5B, portion 301N is thus arranged on the right-hand side of trench 309 and portion 301P is thus arranged on the left-hand side of trench 309. Trench 309 has, in top view, the shape of a strip (FIG. 5A) extending along the entire length of structure 300. Trench 309 does not extend all the way to the lower surface of substrate 301, and an N-P junction JT2 between 301N and 301P is thus formed under insulating trench 309.

Structure 300 further comprises a very heavily-doped P-type well 311 (shown in FIGS. 5A and 5B) (P+) extending from the upper surface of portion 301N. In other words, well 311 is arranged on the same side of trench 309 as portion 301N. Well 311 has, in top view (FIG. 5A), the shape of a strip extending across the entire width of structure 300, parallel to insulating trench 309. The limit between portion 301N and well 311 forms a P-N junction JT1. Well 311 forms the anode of thyristor 110 described in relation with FIG. 3. Well 311 may be directly coupled to terminal IN.

Structure 300 further comprises a heavily-doped N-type well 313 (N+) (shown in FIGS. 5A and 5B). Well 313 is formed from a portion of semiconductor layer 305 arranged on the side of the insulating trench, and from a coupling well 315 of the type of the coupling well 29 described in relation with FIG. 1. Well 313 has, in top view (FIG. 5A), the shape of a strip extending across the entire structure 300, parallel to insulating trench 309 and to well 311. The lower surface of well 313 is in contact with portion 301P of substrate 301 and forms a P-N junction JT3. Well 313 forms the cathode of thyristor 110. Well 313 further forms the source of transistor 120 described in relation with FIG. 3. In other words, well 313 may be directly connected to terminal OUT.

Structure 300 further comprises a lightly-doped P-type region 317 (P−) formed in a portion of semiconductor layer 305 in contact with buried insulating layer 303. Channel region 317 is topped with a gate stack 319 comprising a gate oxide layer 321 covered with a gate conductor layer 323. The stack is laterally protected by insulating spacers 325. Channel region 317 forms the channel region of transistor 120. Gate stack 319 forms the gate region of transistor 120.

Channel region 317 (FIG. 5B) and gate stack 319 have, in top view (FIG. 5A), a shape comprising: a first strip-shaped portion extending across the entire width of structure 300; and a second C-shaped portion comprising a main branch and two parallel secondary branches extending from the main branch to the side opposite to well 313.

The main branch of the C-shaped portion is solid with the first strip-shaped portion. The specific shape of channel region 317 and of gate stack 319 enables to define three areas D, E, and F. Area E is arranged between the two parallel secondary branches (FIG. 5A). Areas D and F are arranged on either side of the secondary branches (FIG. 5A).

Area E defines a very heavily-doped P-type portion of semiconductor layer 305 (P+). This portion overhangs a second very heavily-doped P-type well (P+). The assembly of said portion of semiconductor layer 305 and of said coupling well forms a very heavily-doped P-type well 327 (P+). Well 327 forms the gate region of thyristor 110. Well 327 further forms the channel contact region of transistor 120. Further, the presence of the second coupling well may also form a substrate contact of transistor 120.

Areas D and F define portions 329 (FIG. 5A) of heavily-doped N-type semiconductor layer 305 (N+). Portions 329 form drain regions of transistor 120. Portions 329 may be directly connected to terminal IN.

Figure 6:
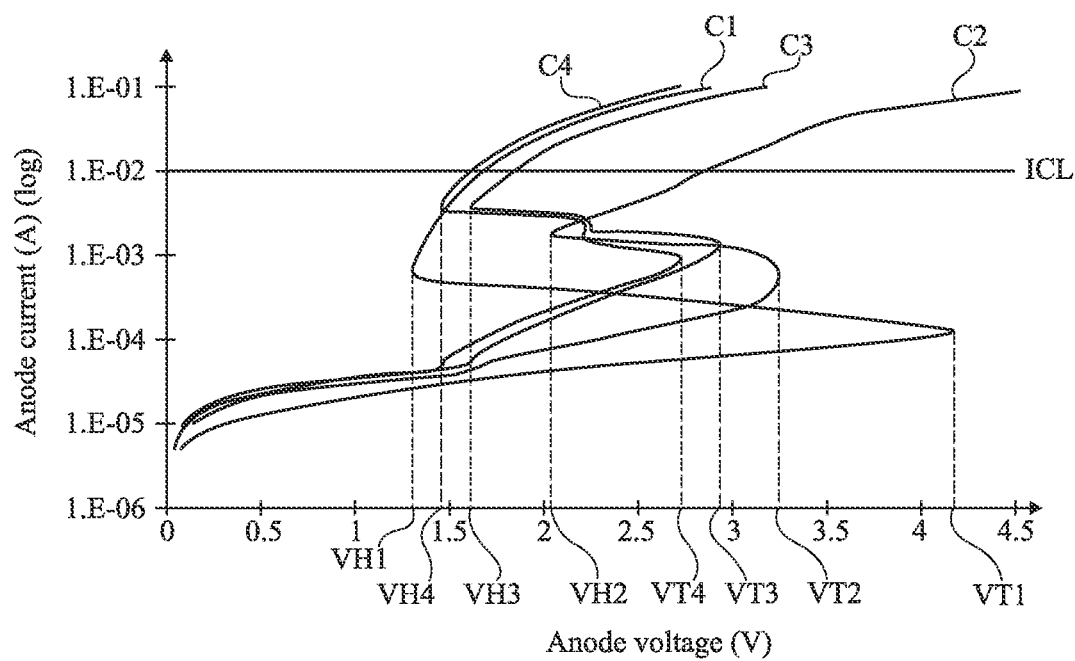
FIG. 6 is a graph illustrating the performance of the circuit of FIG. 5.

FIG. 6 is a graph comprising curves illustrating current-vs.-voltage characteristics of electrostatic discharge protection circuits.

Each curve has been obtained by applying a linear current increase, or current ramp, to said circuits, particularly a current ramp starting from approximately 0 A and rising up to approximately 0.1 A for a duration of approximately 100 ns.

The graph comprises an axis of abscissas in volts (V) and a logarithmic axis of ordinates in amperes (A).

More particularly, the graph comprises:
a curve C1 illustrating the behavior of a circuit only comprising a thyristor of dimensions equivalent to the thyristor 110 of circuit 100 described in relation with FIGS. 5A-5B;
a curve C2 illustrating the behavior of a circuit only comprising a BiMOS-type transistor having dimensions equivalent to transistor 120 of the circuit described in relation with FIGS. 5A-5B;
a curve C3 illustrating the performance of a circuit 100, which, instead of using a coupling well to connect thyristor 110 and transistor 120, uses wire connections; and
a curve C4 illustrating the performance of circuit 100 according to the structure described in relation with FIGS. 5A-5B.

Each of these curves enables to determine the trigger voltage and the maintaining voltage. The trigger voltage is the voltage from which the circuit triggers and becomes conductive. The maintaining voltage is the voltage across the circuit after triggering.

The circuits of curves C1 to C4 have a power supply voltage of approximately 1 V. According to curves C1 to C4, the different circuits have the following trigger and maintaining voltages:

TABLE 1

| Curves | Trigger voltage | Maintaining voltage |
| --- | --- | --- |
| Curve C1 | VT1 = 4.1 V | VH1 = 1.3 V |
| Curve C2 | VT2 = 3.2 V | VH2 = 2.0 V |
| Curve C3 | VT3 = 2.9 V | VH3 = 1.6 V |
| Curve C4 | VT4 = 2.7 V | VH4 = 1.5 V |

The trigger voltage of circuit 100 according to the structure described in relation with FIGS. 5A-5B (VT4) is the lowest trigger voltage among those of the other circuits. The closer the trigger voltage is to the power supply voltage, while remaining higher than the power supply voltage (for example, while remaining greater than approximately 10% of the power supply voltage), the better the circuit to be protected is protected against overvoltages. Indeed, the closer the trigger voltage is to the power supply voltage, the more the trigger voltage deviates from a limiting voltage where the circuit risks deteriorations.

The maintaining voltage of circuit 100 according to the structure described in relation with FIGS. 5A-5B is a good compromise among those of the other circuits, for a power supply voltage of the circuit to be protected in the order of approximately 1 V. The maintaining voltage of circuit 100 enables to keep a margin of approximately 0.5 V, as compared with the power supply voltage.

An advantage of the use of one or a plurality of coupling wells in the structure of circuit 100 described in relation with FIG. 1 thus is that they enable to lower the trigger voltage and to adjust the maintaining voltage of circuit 100.

Figure 7A:
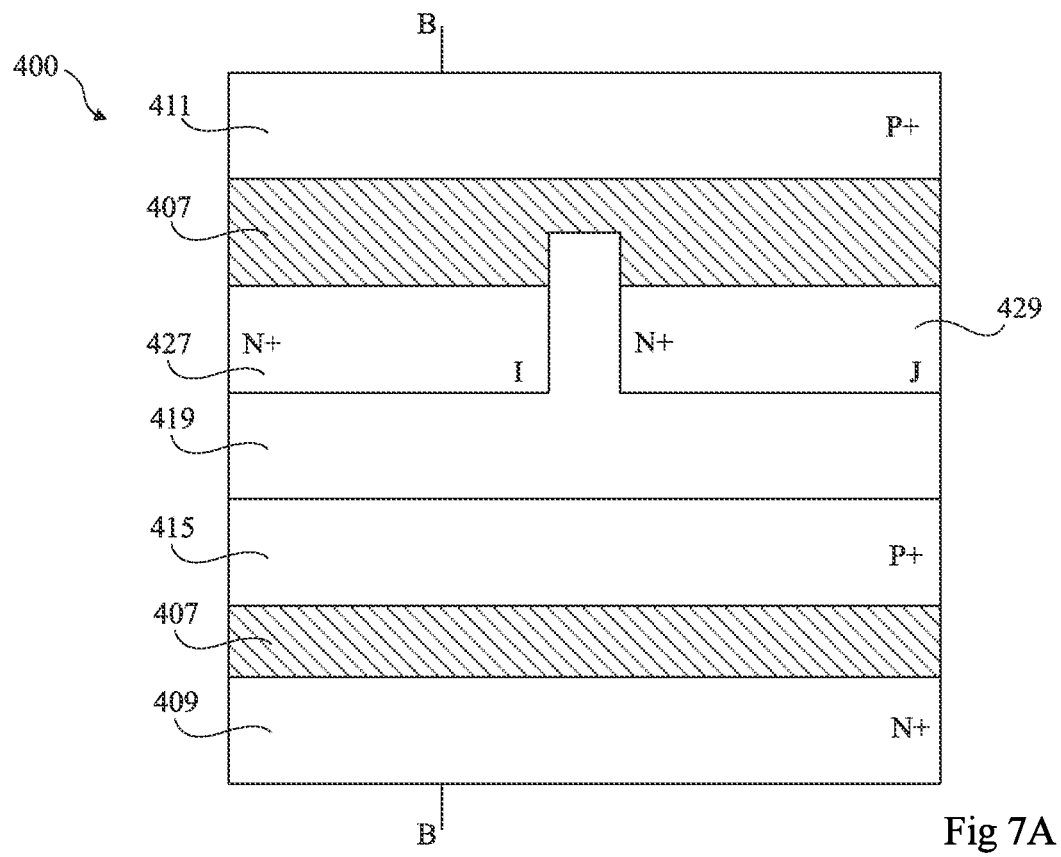
FIGS. 7A and 7B show a top view and a cross-section view, respectively, of another embodiment of the circuit of FIG. 3.
Figure 7B:
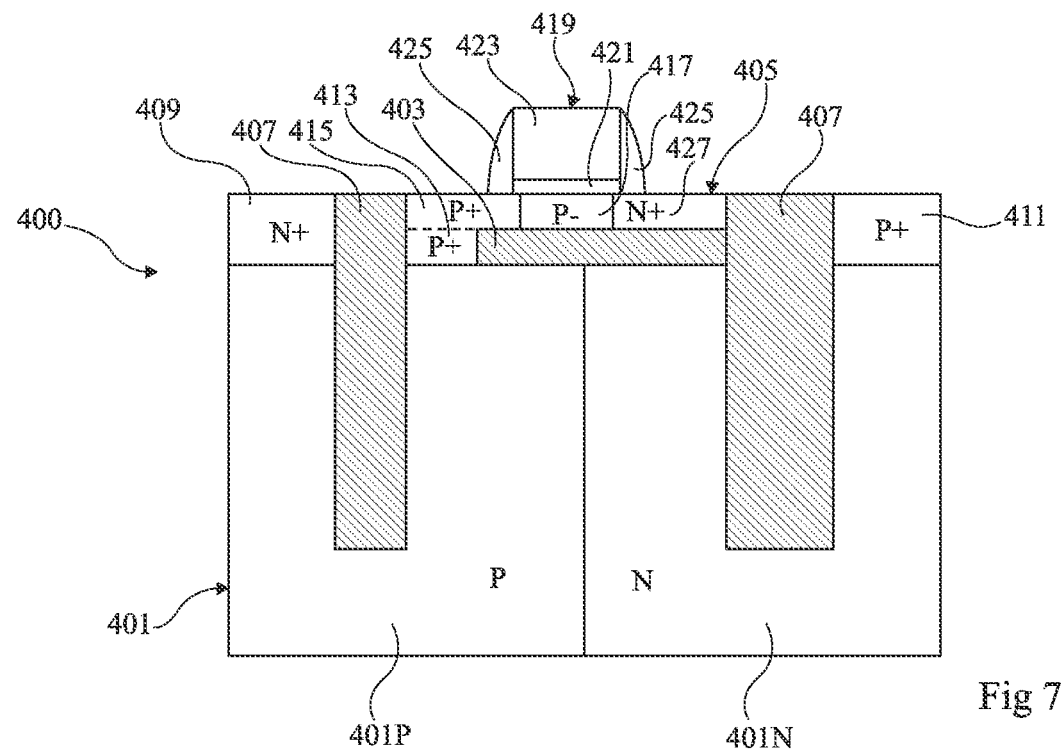

FIGS. 7A and 7B show a top view and a cross-section view, respectively, of an embodiment of a possible second structure 400 of the circuit 100 described in relation with FIG. 3. FIG. 7B is a cross-section view along axis B-B of FIG. 7A.

Structure 400 is formed from a structure of the type of structure 10 described in relation with FIG. 1, wherein: the substrate is a semiconductor substrate 401; the buried insulating layer is an insulating layer 403, for example, made of silicon oxide; the semiconductor layer is a layer 405; and the insulating walls are insulating walls 407, or insulating trenches, extending from the upper surface of the structure down to a depth beyond the lower surface of insulating layer 403.

Substrate 401 (FIG. 7B) is divided into an N-type doped portion 401N (N) and a P-type doped portion 401P (P). Each portion 401N and 401P is crossed by an insulating trench 407. In FIG. 7B, portion 401N is arranged on the right-hand side of the drawing, and portion 401P is arranged on the left-hand side.

Insulating walls 407 have, in top view (FIG. 7A), the shape of strips parallel to each other extending across the entire width of structure 400.

Structure 400 further comprises a very heavily-doped N-type well 409 (N+) (FIGS. 7A and 7B) extending from the upper surface of portion 401P of substrate 401 on the outer side of one of insulating trenches 407 (on the left-hand side of FIG. 7B). Well 409 is, for example, formed from a portion of the semiconductor layer and of a coupling well formed in buried insulating layer 403 before the forming of insulating walls 407. Well 409 has, in top view (FIG. 7A), the shape of a strip extending across the entire width of structure 400 parallel to insulating walls 407. Well 409 forms the cathode of thyristor 110 of circuit 100.

Structure 400 further comprises a very heavily-doped P-type well 411 (P+) (FIGS. 7A and 7B) extending from the upper surface of portion 401N of substrate 401 on the outer side of one of insulating trenches 407 (on the right-hand side in FIG. 7B). Well 411 is arranged on the opposite side of well 409. Well 411 is for example formed from a portion of the semiconductor layer and of a coupling well formed in buried insulating layer 403 before the forming of insulating walls 407. Well 411 has, in top view, the shape of a strip extending across the entire width of structure 400. Well 411 forms the anode of thyristor 110 of circuit 100.

Portions 401N and 401P form the two other N-type and P-type doped regions of thyristor 110. Buried insulating layer 403 comprises a very heavily-doped P-type coupling well 413 (P+). Well 413 enables to couple region 401P to a very heavily-doped P-type portion 415 of semiconductor layer 405 (P+). Portion 415 has, in top view, the shape of a strip extending across the entire width of structure 400 parallel to wells 409, 411 and to insulating walls 407. Portion 401P, well 413, and portion 415 of layer 405 form the gate region of thyristor 110. Well 413 and portion 415 of layer 405 further form the channel contact region of transistor 120. Well 413 may also form a substrate contact of transistor 120.

Semiconductor layer 405 comprises a lightly-doped P-type portion 417 (P−) (FIG. 7B) in contact with very heavily-doped P-type portion 415 (P+). Portion 417 is topped with a gate stack 419 comprising a gate oxide layer 421 covered with a gate conductor layer 423. Stack 419 is laterally protected by insulating spacers 425. Portion 417 forms the channel region of transistor 120. Gate stack 419 forms the gate region of transistor 120.

Portion 417 (FIG. 7B) and gate stack 419 have, in top view (FIG. 7A), a shape comprising: a first strip-shaped portion extending across the entire width of structure 400 parallel to wells 409, 411 and to insulating walls 407; and a second strip-shaped portion arranged perpendicularly to the first portion and extending from the first portion to the insulating trench 407 extending on the side of portion 401N of the substrate.

The specific shape of portion 417 and of gate stack 419 enables to define two areas I and J in semiconductor layer 405.

Area I comprises a very heavily-doped N-type well 427 (N+) (FIGS. 7A and 7B). Well 427 forms the drain region of transistor 120.

Area J comprises a very heavily-doped N-type well 429 (N+) (FIG. 7A). Well 429 forms the source region of transistor 120.

Figure 8:
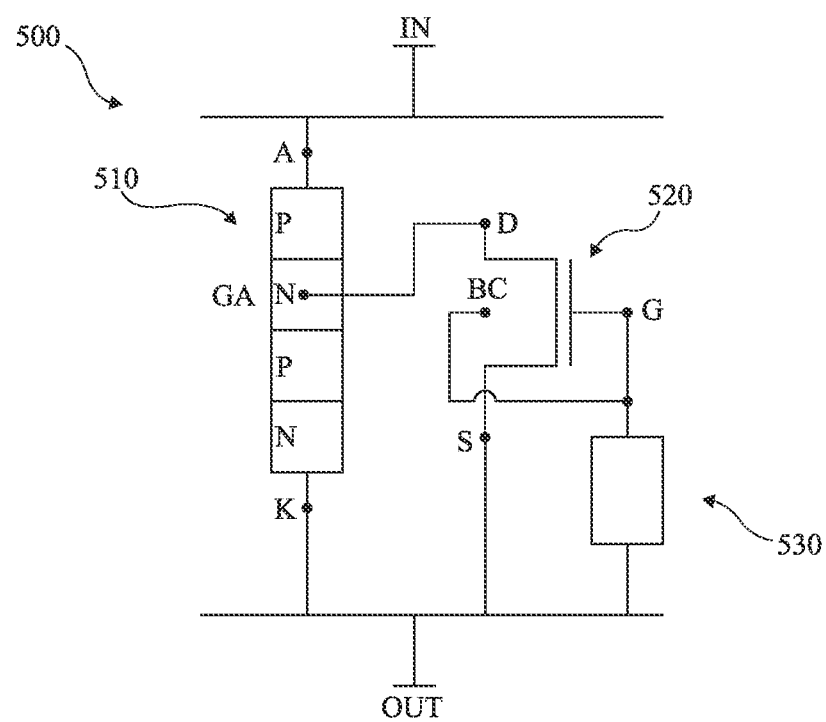
FIG. 8 shows a circuit diagram of another embodiment of an electronic circuit according to FIG. 1.

FIG. 8 is an electric diagram of an example of a circuit 500 capable of being formed in a structure of the type of the structure described in relation with FIG. 1.

Circuit 500 is a variation of circuit 100 where the thyristor used is an anode-gate thyristor.

Circuit 500 thus comprises: an input terminal IN; an output terminal OUT; an anode-gate thyristor 510; a BiMOS-type transistor 520 identical to the transistor 120 described in relation with FIG. 3; and a resistor 530 identical to the resistor 130 described in relation with FIG. 3.

As in FIG. 3, thyristor 510 is represented by its physical model representing its doping structure. The anode of thyristor 510 is formed by the layer at one of its P-type doped ends, and is symbolized by a node A. The cathode of thyristor 510 is formed by the layer of the other N-type doped end, and is symbolized by a node K. The gate of thyristor 510 is formed by the N-type doped layer on the anode layer side. The gate is symbolized by a node GA.

Anode A of thyristor 510 is coupled, preferably connected, to terminal IN. Cathode K of thyristor 510 is coupled, preferably connected, to terminal OUT.

As in FIG. 3, BiMOS-type transistor 520 comprises an N-type doped drain region, symbolized by a node D, a gate region, symbolized by a node G, an N-type doped source region, symbolized by a node S, and a P-type doped channel contact region, symbolized by a node BC.

Drain D of transistor 520 is coupled, preferably connected, to gate GA of thyristor 510. Source S of transistor 520 is coupled, preferably connected, to terminal OUT. Gate G of transistor 520 is coupled, preferably connected, to channel contact BC of transistor 520.

Gate G of transistor 520 is coupled to terminal OUT via resistor 530. In other words, gate G of transistor 520 is coupled, preferably connected, to a terminal of resistor 530. The other terminal of resistor 530 is coupled, preferably connected, to terminal OUT.

Circuit 500 operates as follows.

When a positive electrostatic discharge occurs on terminal IN of circuit 500, it passes the first P-N junction of thyristor 510 and reaches the drain of transistor 520. According to the operation described in relation with FIG. 4, transistor 520 turns on and the potential at the gate of thyristor 510 decreases to trigger thyristor 510. Thyristor 510 then dissipates the electrostatic discharge.

Figure 9A:
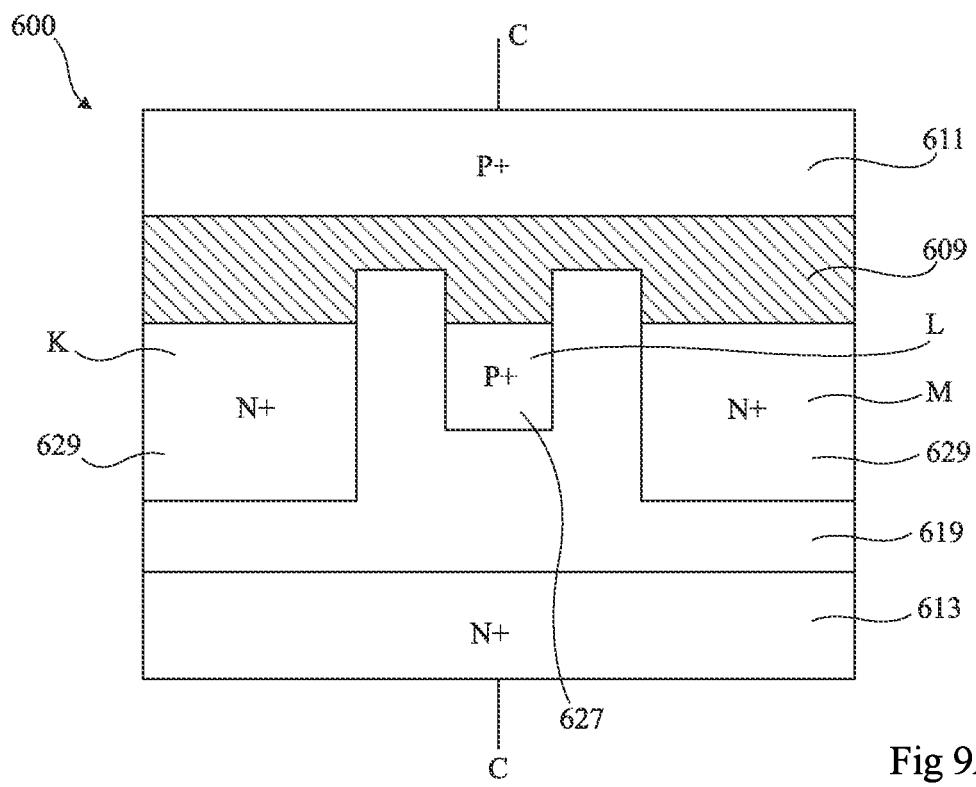
FIGS. 9A and 9B show a top view and a cross-section view, respectively, of an embodiment of the circuit of FIG. 8.
Figure 9B:
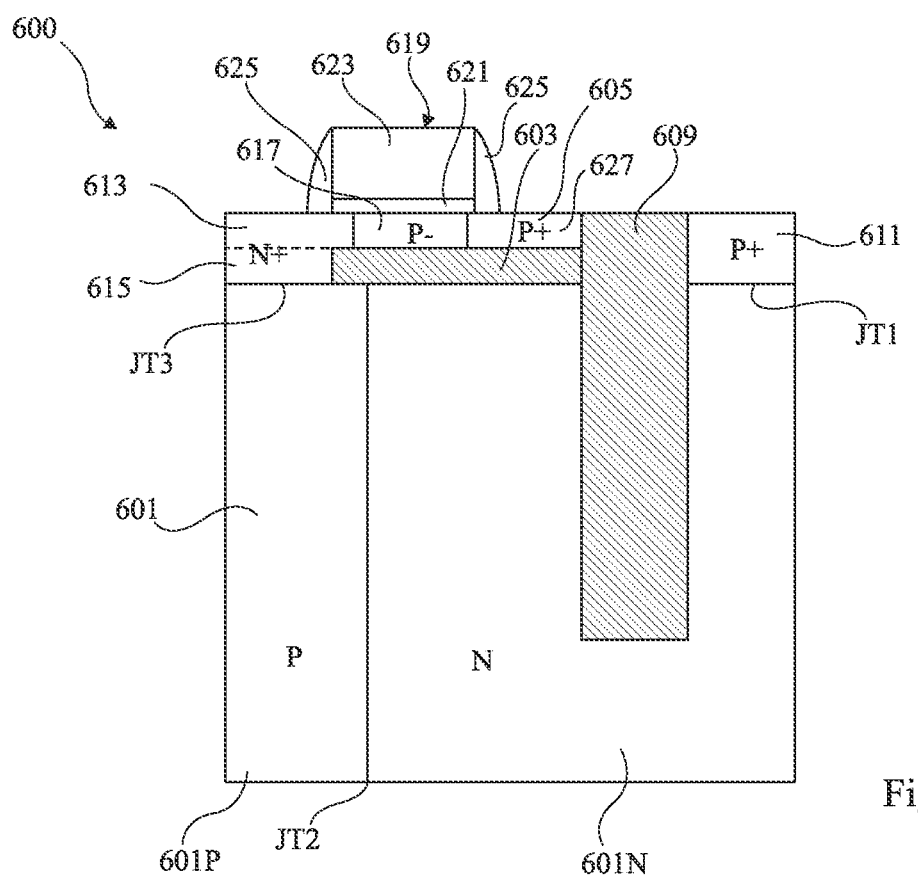

FIGS. 9A and 9B shows a top view and a cross-section view, respectively, of an embodiment of a possible structure 600 of the circuit 500 described in relation with FIG. 8. FIG. 9B is a cross-section view along axis C-C of FIG. 9A.

Structure 600 is formed from a structure of the type of structure 10 described in relation with FIG. 1 but comprising a single insulating wall (FIG. 9B), wherein: the substrate is a semiconductor substrate 601 divided into a P-type doped portion 601P (P) and an N-type doped portion 601N (N); the buried insulating layer is an insulating layer 603, for example, made of silicon oxide; and the semiconductor layer is a layer 605; and the insulating wall is an insulating trench 609 extending from the upper surface of the structure down to a depth beyond the lower surface of insulating layer 603.

Insulating trench 609 (FIGS. 9A and 9B) is formed in portion 601N of substrate 601. In FIGS. 9A-9B, portion 601P is thus arranged on the left-hand side of trench 609.

Trench 609 has, in top view, the shape of a strip (FIG. 9A) extending across the entire width of structure 600. An N-P junction JT2 is formed by portions 601N and 601P under insulating layer 603.

Structure 600 further comprises a very heavily-doped P-type well 611 (shown in FIGS. 9A and 9B) (P+) extending from the upper surface of portion 601N. In other words, well 611 is arranged on the same side of trench 609 as portion 601N. Well 611 has, in top view (FIG. 9A), the shape of a strip extending across the entire width of structure 600, parallel to insulating trench 609. The limit between portion 601N and well 611 forms a P-N junction JT1. Well 611 forms the anode of thyristor 510. Well 611 may be directly coupled to terminal IN.

Structure 600 further comprises a very heavily-doped N-type doped well (N+) 613 (shown in FIGS. 9A and 9B). Well 613 is formed from a portion of semiconductor layer 605 arranged on the side of the insulating trench, and from a coupling well 615 of the type of the coupling well 29 described in relation with FIG. 1. Well 613 has, in top view (FIG. 9A), the shape of a strip extending across the entire width of structure 600, parallel to insulating trench 609 and to well 611. The lower surface of well 613 is in contact with portion 601P of substrate 601 and forms a P-N junction JT3. Well 613 forms the cathode of thyristor 510. Well 613 further forms the source of transistor 520. In other words, well 613 may be directly connected to terminal OUT.

Structure 600 further comprises a lightly-doped P-type region 617 (P−) formed in a portion of semiconductor layer 605 in contact with buried insulating layer 603. Channel region 617 is topped with a gate stack 619 comprising a gate oxide layer 621 covered with a gate conductor layer 623. The stack is laterally protected by insulating spacers 625. Channel region 617 forms the channel region of transistor 520. Gate stack 619 forms the gate region of transistor 520.

Channel region 617 (FIG. 9B) and gate stack 619 have, in top view (FIG. 9A), a shape comprising: a first strip-shaped portion extending across the entire width of structure 600; and a second C-shaped portion comprising a main branch and two parallel secondary branches extending from the first portion to trench 609.

Further, N-P junction JT2, formed by 601N and 601P of substrate 601, is formed under insulating layer 603 and more particularly at the level of the first portion of the shape of channel region 617 and of gate stack 619.

The main branch of the C-shaped portion is solid with the first strip-shaped portion. The particular shape of channel region 617 and of gate stack 619 enables to define three areas K, L, and M. Area L is arranged between the two parallel secondary branches (FIG. 9A). Areas K and M are arranged on either side of the secondary branches (FIG. 9A).

Area L defines a very heavily P-type doped portion 627 of semiconductor layer 605 (P+). Portion 627 forms the channel contact region of transistor 520.

Areas K and M define very heavily-doped N-type portions 629 (N+) of semiconductor layer 605. Portions 629 form drain regions of transistor 520. Portions 629 overhang coupling wells (not shown in FIGS. 9A and 9B) crossing insulating layer 603 and enabling to couple gate region 601N of thyristor 510 to the drain region of transistor 520.

Various embodiments and variations have been described. It will be understood by those skilled in the art that certain features of these various embodiments and variations may be combined, and other variations will occur to those skilled in the art. In particular, examples of circuits capable of being formed inside and on top of a structure of the type of that in FIG. 1 have been described, but other circuits may be imagined.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An electronic circuit, comprising:
a semiconductor substrate including a first region doped with a first conductivity type and a second region doped with a second conductivity type;
a cathode region doped with the second conductivity type in contact with the first doped region;
an anode region doped with the first conductivity type in contact with the second region;
an insulating layer extending over both the first doped region and the second doped region;
a semiconductor layer extending over the insulating layer, said semiconductor layer including a source region doped with the second conductivity type, a channel region doped with the first conductivity type and a drain region doped with the second conductivity type;
a first insulating wall extending into the first doped region between the cathode region and source region;
a second insulating wall extending into the second doped region between the anode region and drain region;
a contact region doped with the first conductivity type, positioned to cross through a thickness of the insulating layer, and electrically coupled between channel region and the source region and the first region;
an insulated gate electrode extending over the channel region;
wherein the anode region is electrically connected to the drain region;
wherein said anode region, second region, first region and cathode region form a thyristor; and
wherein said source region, channel region, drain region and insulated gate electrode form a transistor.

2. The electronic circuit of claim 1, further comprising a coupling well doped with the first conductivity type in the semiconductor layer and in contact with the contact region, and wherein said insulated gate electrode is electrically connected to the channel region through the coupling well.

3. The electronic circuit of claim 1, wherein said insulated gate electrode is electrically connected to the first region.

4. The circuit of claim 1, being an electrostatic discharge protection circuit.

5. The circuit of claim 1, wherein the transistor is a trigger device for triggering actuation of the thyristor.

6. The circuit of claim 5, wherein the transistor comprises a BiMOS-type transistor.

7. The circuit of claim 1, wherein the first conductivity type is p type and the second conductivity type is n type.

8. The circuit of claim 1, further comprising a resistor coupled between the insulated gate electrode and both the source region and cathode region.

9. The circuit of claim 1, wherein the first and second insulating walls extend in strips parallel to each other and wherein the insulated gate electrode extends parallel to the strips of first and second insulating walls.

10. The circuit of claim 9, wherein the insulated gate electrode includes a portion extending perpendicular to the strips of the first and second insulating walls and positioned over the channel region between the source region and the drain region.

11. An electronic circuit, comprising:
a semiconductor substrate including a first region doped with a first conductivity type and a second region doped with a second conductivity type;
an anode region doped with the first conductivity type in contact with the second region;
an insulating layer extending over the second doped region;
a semiconductor layer extending over the insulating layer, said semiconductor layer including a source region doped with the second conductivity type, a channel region doped with the first conductivity type and a drain region doped with the second conductivity type;
an insulating wall extending into the second region between the drain region and the anode region;
a cathode region doped with the second conductivity type, positioned to cross through a thickness of the insulating layer, and in contact with both the source region and the first region; and
an insulated gate electrode extending over the channel region;
wherein said insulated gate electrode is electrically connected to the channel by a channel contact region doped with the first conductivity type;
wherein said anode region, second region, first region and cathode region form a thyristor; and
wherein said source region, channel region, drain region and insulated gate electrode form a transistor.

12. The circuit of claim 11, being an electrostatic discharge protection circuit.

13. The circuit of claim 11, wherein the transistor is a trigger device for triggering actuation of the thyristor.

14. The circuit of claim 13, wherein the transistor comprises a BiMOS-type transistor.

15. The circuit of claim 11, wherein the first conductivity type is p type and the second conductivity type is n type.

16. The circuit of claim 11, further comprising a resistor coupled between the insulated gate electrode and both the source region and cathode region.

17. The circuit of claim 11, wherein the insulating wall extend in a strip and wherein the insulated gate electrode extends parallel to the strip of the insulating wall.

18. The circuit of claim 17, wherein the insulated gate electrode includes a first portion extending perpendicular to the strip of the insulating wall and a second portion extending perpendicular to the strip of the insulating wall and wherein said channel contact region is positioned between the first and second portions of the insulated gate electrode.

* * * * *